United States Patent
Reidhead et al.

(10) Patent No.: US 7,162,731 B2
(45) Date of Patent: Jan. 9, 2007

(54) RADIO FREQUENCY CHARACTERIZATION OF CABLE PLANT AND CORRESPONDING CALIBRATION OF COMMUNICATION EQUIPMENT COMMUNICATING VIA THE CABLE PLANT

(75) Inventors: Lance R. Reidhead, Austin, TX (US); Walt Evanyk, Plano, TX (US)

(73) Assignee: Advent Networks, Inc., Austin, TX (US)

( * ) Notice: Subject to any disclaimer, the term of this patent is extended or adjusted under 35 U.S.C. 154(b) by 1128 days.

(21) Appl. No.: 10/072,479

(22) Filed: Feb. 7, 2002

(65) Prior Publication Data

US 2003/0149991 A1 Aug. 7, 2003

(51) Int. Cl.
*H04N 7/173* (2006.01)

(52) U.S. Cl. .................. 725/107; 725/121; 725/124; 725/125; 725/119; 348/180; 348/181; 348/192; 348/193

(58) Field of Classification Search ........ 725/124–125, 725/130, 107, 118–119, 121, 148, 150, 105; 348/180–181, 192–193; 455/226.1, 226.2, 455/226.3, 115.1, 115.2; 375/224, 227
See application file for complete search history.

(56) References Cited

U.S. PATENT DOCUMENTS

| | | | |
|---|---|---|---|
| 4,533,948 A | 8/1985 | McNamara et al. | |
| 5,526,034 A | 6/1996 | Hoarty et al. | |
| 5,544,161 A | 8/1996 | Bigham et al. | |
| 5,557,316 A | 9/1996 | Hoarty et al. | |
| 5,684,799 A | 11/1997 | Bigham et al. | |
| 5,708,961 A | 1/1998 | Hylton et al. | |
| 5,740,075 A | 4/1998 | Bigham et al. | |
| 5,742,713 A | 4/1998 | Sanders et al. | |
| 5,790,523 A * | 8/1998 | Ritchie et al. | 370/241 |
| 5,822,324 A | 10/1998 | Kostresti et al. | |
| 5,982,412 A | 11/1999 | Nulty | |
| 6,151,559 A * | 11/2000 | Williams | 702/58 |
| 6,160,991 A | 12/2000 | Chappell et al. | |
| 6,337,711 B1 | 1/2002 | Dickinson et al. | |
| 6,445,773 B1 * | 9/2002 | Liang et al. | 379/1.04 |
| 6,467,092 B1 * | 10/2002 | Geile et al. | 725/131 |
| 2002/0136165 A1 * | 9/2002 | Ady et al. | 370/241 |
| 2005/0198688 A1 * | 9/2005 | Fong | 725/129 |

* cited by examiner

*Primary Examiner*—Ngoc Vu
(74) *Attorney, Agent, or Firm*—Craig Yudell; Dillon & Yudell LLP (57) ABSTRACT

A switch router and one or more gateways incorporating a diagnostic and calibration system that performs RF characterization of an underlying cable plant. The switch router is connected at a point of insertion or point of distribution and each gateway is located downstream, such as at corresponding subscriber locations. The switch router and each gateway sends a test signal with known characteristics and power level, and the receiving device determines noise level and power loss for the corresponding downstream and upstream channel pair. The power loss information is used to calibrate the power level of the transmitters. The noise levels are used to determine if the selected modulation schemes employed for normal communications is realizable. A frequency analysis, such as FFT or the like, is performed on the upstream test signal spectrum to derive valuable frequency information for the upstream channel or the entire upstream bandwidth.

28 Claims, 3 Drawing Sheets

RADIO FREQUENCY CHARACTERIZATION OF CABLE PLANT AND CORRESPONDING CALIBRATION OF COMMUNICATION EQUIPMENT COMMUNICATING VIA THE CABLE PLANT

FIELD OF THE INVENTION

The present invention relates to information cable plants employed for telecommunications, and more particularly, to characterization of cable plants and calibration of associated communication equipment.

DESCRIPTION OF RELATED ART

The demand for broadband content by business and residential subscribers is continually increasing. Broadband content includes multiple types of entertainment programming, communications and data, such as broadcast television channels, video on demand, streaming video, multimedia data, internet access, voice-over-IP, etc. To meet the increasing demand, it is necessary to increase bandwidth to each subscriber and to improve quality of service. Existing delivery technologies include several variations of DSL (digital subscriber line) technology, such as ADSL (asymmetrical DSL) and the like, which uses telephony technology, cable modem systems using television technology and HFC (hybrid fiber coax) distribution networks, 2-way wireless local loop (WLL), including 2-way satellite, etc. The existing legacy technology for providing broadband content is becoming increasingly inadequate to meet the demand.

Cable modem systems for delivery of data services using Data-Over-Cable Service Interface Specifications (DOCSIS) utilize the television broadcast spectrum and television technology to broadcast so-called broadband data to subscribers. One problem with delivery of broadband data (video on demand, streaming video, etc.) using existing HFC networks is the limitation on available delivery spectrum. The television data delivery systems have been established to deliver data to subscribers over a television broadcast spectrum extending from approximately 15 Megahertz (MHz) to approximately 860 MHz. Delivery of analog television downstream to the subscriber occupies the spectrum between approximately 54 MHz to 550 MHz, which leaves a relatively small range of spectrum for the delivery of digital information over HFC cable modem systems. The diplex filter separating the downstream from the upstream is located within the frequency range of approximately 42 to 54 MHz in an extended sub-split frequency plan, which is common for most consumer-based HFC systems. Therefore, the two effective delivery frequency ranges using typical consumer-based HFC systems are those between approximately 5–42 MHz (upstream) and those between approximately 550–860 MHz (downstream). Other frequency plans are known in which the diplex filter is shifted in the applicable frequency spectrum.

DOCSIS is an existing standard that specifies the methodology for delivering data services over an HFC plant. DOCSIS defines a Cable Modem Termination System (CMTS), which is an entity used to deliver data services over an HFC network from a central distribution point. DOCSIS systems use a shared frequency channel to broadcast all data to every downstream subscriber, and thus are limited in data throughput capacity. Newer standards and technologies are emerging that provide significantly greater throughput capacity than existing cable modem systems. For example, one system being developed utilizes multiple channels for data transfer and uses more sophisticated modulation techniques to increase throughput per channel. Each channel may further be subdivided into dedicated sub-streams to individual subscribers.

The characterization of a cable plant was often unknown during cable equipment installation. As long as the underlying cable plant met minimal operating characteristics, however, equipment based on legacy standards, such as DOCSIS or the like, operated correctly or at least within acceptable quality of service (QoS) parameters. If problems arose, the intermediate network was examined and repaired. Such methodology often significantly increased installation time and cost and the amount of equipment and human error in the field. Deployment of proper test equipment and trained personnel was often required in order to complete each installation with success. Furthermore, newer technologies require higher quality connections thereby increasing the problems associated with traditional installation methodology. The problems were exacerbated since the intermediate network was, and still is, often owned by a separate entity from the owner or operator of cable equipment on either end, resulting in reduced control of the installation, troubleshooting and repair activities. These problems were also compounded for older cable plants with significant variations, and unknown quality levels and characteristics.

It is desired to improve the installation process by reducing installation time and associated cost. It is desired to reduce the amount of equipment and human errors in the field during installation and during normal operation.

It is appreciated that RF characterization of a cable plant and corresponding calibration of communication equipment according to embodiments of the present invention provides several benefits and advantages. The diagnostic and calibration capability may be built into the cable communication equipment being installed. The diagnostic information is used to calibrate equipment during installation and periodically during normal operation or in the event of malfunction or failure. The diagnostic procedure provides early and real-time characterization of the underlying cable network, dynamically establishes a system RF link budget, and significantly reduces installation time and the amount of equipment and human errors in the field.

A particularly significant benefit is that the need for specialized test equipment is significantly reduced. The diagnostic system provides invaluable network characterization information and facilitates the installation process. The diagnostic system further may be used at any time during normal operation or in the event of network problems. The installation process for each gateway is streamlined and simplified and the existence of multiple gateways distributed on multiple subscriber links establishes a powerful diagnostic tool to isolate and locate network problems. In this manner, the diagnostic system is able to characterize multiple downstream channels since multiple gateways can occupy the same channel.

SUMMARY OF THE INVENTION

A bi-directional cable communication system according to an embodiment of the present invention is configured to communicate information via a cable network and incorporates a diagnostic and calibration system. The cable communication system includes a first transceiver coupled at a selected point of distribution of the cable network and a second transceiver coupled to the cable network at a selected downstream location. The first transceiver transmits a downstream test signal having predetermined characteristics on the cable network in a selected downstream channel at a predetermined power level. The first transceiver receives corresponding downstream diagnostic information in a selected upstream channel from the second transceiver, where the downstream diagnostic information includes a downstream power loss metric. The first transceiver calibrates downstream transmission power based on the downstream power loss. The second transceiver receives the downstream test signal in the selected downstream channel and compares the received signal with the predetermined characteristics and power level to determine the downstream diagnostic information, which includes a downstream power loss metric and a downstream noise level metric for the selected downstream channel. The second transceiver transmits the downstream diagnostic information in a selected upstream channel.

The second transceiver also transmits an upstream test signal with predetermined characteristics on the cable network in the selected upstream channel at a predetermined power level, and receives corresponding upstream power information in the downstream channel. The second transceiver calibrates upstream transmission power based on the upstream power information. The first transceiver receives the upstream test signal and compares the received upstream test signal with the predetermined characteristics and power level to determine corresponding upstream diagnostic information. The upstream diagnostic information includes an upstream power loss metric and an upstream noise level metric in the upstream channel. The first transceiver determines the upstream power information based on the upstream power loss metric, and transmits the power information in the selected downstream channel if the output power of the second transceiver needs to be adjusted.

The first transceiver may include diagnostic logic that determines if downstream communication using a selected downstream modulation scheme is realizable based on the downstream noise level. The diagnostic logic also determines whether upstream communication using a selected upstream modulation scheme is realizable based on the upstream noise level. The downstream and upstream noise level metrics may each comprise a signal to noise ratio. The upstream and downstream modulation schemes may be based on quadrature-amplitude modulation (QAM), such as QAM-256 for the downstream modulation scheme and QAM-16 for the upstream modulation scheme. The predetermined characteristics for both the downstream and upstream test signals may include frequency, timing and amplitude information. For example, the downstream test signal may be a tone based on a selected constellation point of a QAM-256 constellation and the upstream test signal may be a tone based on a selected constellation point of a QAM-16 constellation.

The first transceiver may further be configured to determine upstream spectrum information from the upstream test signal. In this embodiment, the diagnostic logic may perform a frequency transform of the upstream spectrum information to determine upstream frequency characteristics. For example, the diagnostic logic may perform a Fast-Fourier Transform (FFT) of the upstream spectrum information to determine the frequency characteristics of the upstream communication bandwidth.

A communication system according to another embodiment of the present invention is configured to communicate across a cable system having a point of distribution and at least one downstream subscriber cable link. The communication system is further configured to operate in a diagnostic and calibration mode. The communication system includes a switch router coupled at the point of distribution, and one or more gateways coupled to corresponding downstream subscriber cable links. The switch router transmits a predetermined downstream test signal at a predetermined power level using a selected downstream channel, and receives corresponding downstream channel diagnostic information including downstream channel power loss. The switch router calibrates transmission power for the downstream channel based on the downstream channel power loss. The switch router also receives an upstream test signal and determines corresponding upstream channel power loss and noise level, and transmits corresponding upstream channel power information on the selected downstream channel. Each gateway transmits a predetermined upstream test signal at a predetermined power level in a selected upstream channel, and receives corresponding upstream channel power information. Each gateway calibrates transmission power of its upstream channel based on the upstream channel power information. The gateway farther receives a downstream test signal and determines downstream channel diagnostic information including downstream channel power loss and noise level, and transmits the downstream channel diagnostic information in the selected upstream channel.

Multiple gateways are contemplated, where the switch router and the plurality of gateways collectively operate to perform diagnostics and to calibrate a corresponding pair of downstream and upstream channels for each gateway. The switch router may further be used to determine if downstream communication is realizable using the selected downstream modulation scheme for the selected downstream channel based on the measured downstream noise level. Also, the switch router determines if upstream communication is realizable using the selected upstream modulation scheme for the selected upstream channel based on the measured upstream noise level.

The switch router may include a controller, a downstream modulator, a radio frequency (RF) downstream transmitter, an RF upstream receiver and an upstream demodulator. The switch router controller operates the switch router in the diagnostic mode. The downstream modulator operates according to a selected downstream modulation scheme for providing IF modulation information, and generates the predetermined downstream test signal as a tone based on a predetermined constellation point. The RF downstream transmitter converts the IF modulation information into a corresponding RF signal and transmits the RF signal in a downstream channel at a power level selected by the switch router controller. The RF upstream receiver is tuned to a selected upstream channel to convert received upstream RF signals into an IF signals. The upstream demodulator operates according to a selected upstream modulation scheme, controls receiver gain and provides a gain level indicative thereof, and determines the upstream channel power loss and noise level based on the received upstream test signal. The switch router controller determines upstream power information and transmits the upstream power information in the selected downstream channel via the downstream modulator. Again, the selected downstream modulation scheme may be QAM-256 and the selected upstream modulation scheme may be QAM-16.

The upstream demodulator may farther be configured to determine upstream spectrum information using the received upstream test signal. The switch router controller includes a processor that performs a frequency transform on the upstream spectrum information.

Each gateway may include a tuner, a receiver gain control circuit, a downstream demodulator, a gateway controller, an upstream modulator, and a programmable gain device. The tuner is tuned to a selected downstream channel to receive and convert RF signals into corresponding IF signals. The receiver gain control circuit controls gain of received IF signals and generates a gain level value indicative thereof. The downstream demodulator operates according to the selected downstream modulation scheme to demodulate IF signals. The downstream demodulator also compares a downstream test signal with a predetermined downstream modulation constellation point to determine an error value. The gateway controller determines downstream channel diagnostic information including downstream power loss and noise level of a selected downstream channel based on the gain level value and the error value. The gateway controller also forwards the downstream channel diagnostic information for upstream transmission, and programs a gain control value to calibrate upstream power level based on received upstream power information. The upstream modulator operates according to the selected upstream modulation scheme and generates an RF upstream test signal based on a predetermined upstream modulation constellation point. The upstream modulator also converts the downstream channel diagnostic information into an RF diagnostic signal and transmits the RF diagnostic signal in the selected upstream channel. The programmable gain device amplifies signals transmitted by the upstream modulator according to the programmed gain control value.

A method of characterizing a cable network and calibrating a bi-directional cable communication system according to an embodiment of the present includes transmitting a downstream test signal from a point of distribution on the cable network in a selected downstream channel at a predetermined downstream power level, where the downstream test signal has predetermined characteristics, receiving the downstream test signal in the selected downstream channel at a downstream location, determining a downstream power loss metric of the downstream channel by comparing a power level of the received downstream test signal with the predetermined downstream power level, transmitting downstream diagnostic information including the downstream power loss and downstream noise level metrics in a selected upstream channel, calibrating downstream transmit power at the point of distribution based on the downstream power loss metric, transmitting an upstream test signal from the downstream location on the cable network in a selected upstream channel at a second predetermined power level, where the upstream test signal has second predetermined characteristics, receiving the upstream test signal in the selected upstream channel at the point of distribution, determining an upstream power loss metric of the upstream channel by comparing a power level of the received upstream test signal with the predetermined upstream power level, transmitting upstream power information in the selected downstream channel, and calibrating upstream transmit power at the downstream location based on the upstream power information.

The method may further include determining a downstream noise level metric of the downstream channel by comparing the predetermined characteristics of the downstream test signal with corresponding characteristics of the received downstream test signal and determining, based on the downstream noise level metric, if downstream communication is realizable using a selected downstream modulation scheme on the selected downstream channel. The method may further include determining an upstream noise level metric of the upstream channel by comparing the second predetermined characteristics with corresponding characteristics of the received upstream test signal, and determining, based on the upstream noise level metric, if upstream communication is realizable using a selected upstream modulation scheme on the selected upstream channel.

The method may further include generating a test tone based on the selected downstream modulation scheme to develop the downstream test signal, and generating a test tone based on the selected upstream modulation scheme to develop the upstream test signal. Generating a test tone may comprise selecting a constellation point of a selected modulation scheme, in which the selected constellation point has known amplitude, frequency and timing information. Determining downstream and upstream power loss metrics may each comprise performing gain control relative to a target power level, generating a gain error level, and comparing the generated gain error level with a corresponding predetermined power level. Determining downstream and upstream noise level metrics may each comprise comparing frequency, timing and amplitude information between a received test signal and predetermined frequency, timing and amplitude information and generating an error value. Determining if downstream and upstream communication is realizable may each comprise comparing a determined noise level metric with a predetermined threshold signal to noise ratio. The calibrating upstream transmit power at the downstream location may comprise programming a gain level value that controls a programmable gain amplifier.

The method may further include determining an upstream spectrum using the received upstream test signal, and performing a frequency transform function on the upstream spectrum. The frequency transform function provides frequency spectrum information for the upstream frequency bandwidth.

BRIEF DESCRIPTION OF THE DRAWINGS

For a more complete understanding of the present invention, reference is now made to the following description taken in conjunction with the accompanying drawings in which like reference numerals indicate like features and wherein.

DETAILED DESCRIPTION OF EMBODIMENTS OF THE INVENTION

Figure 1:
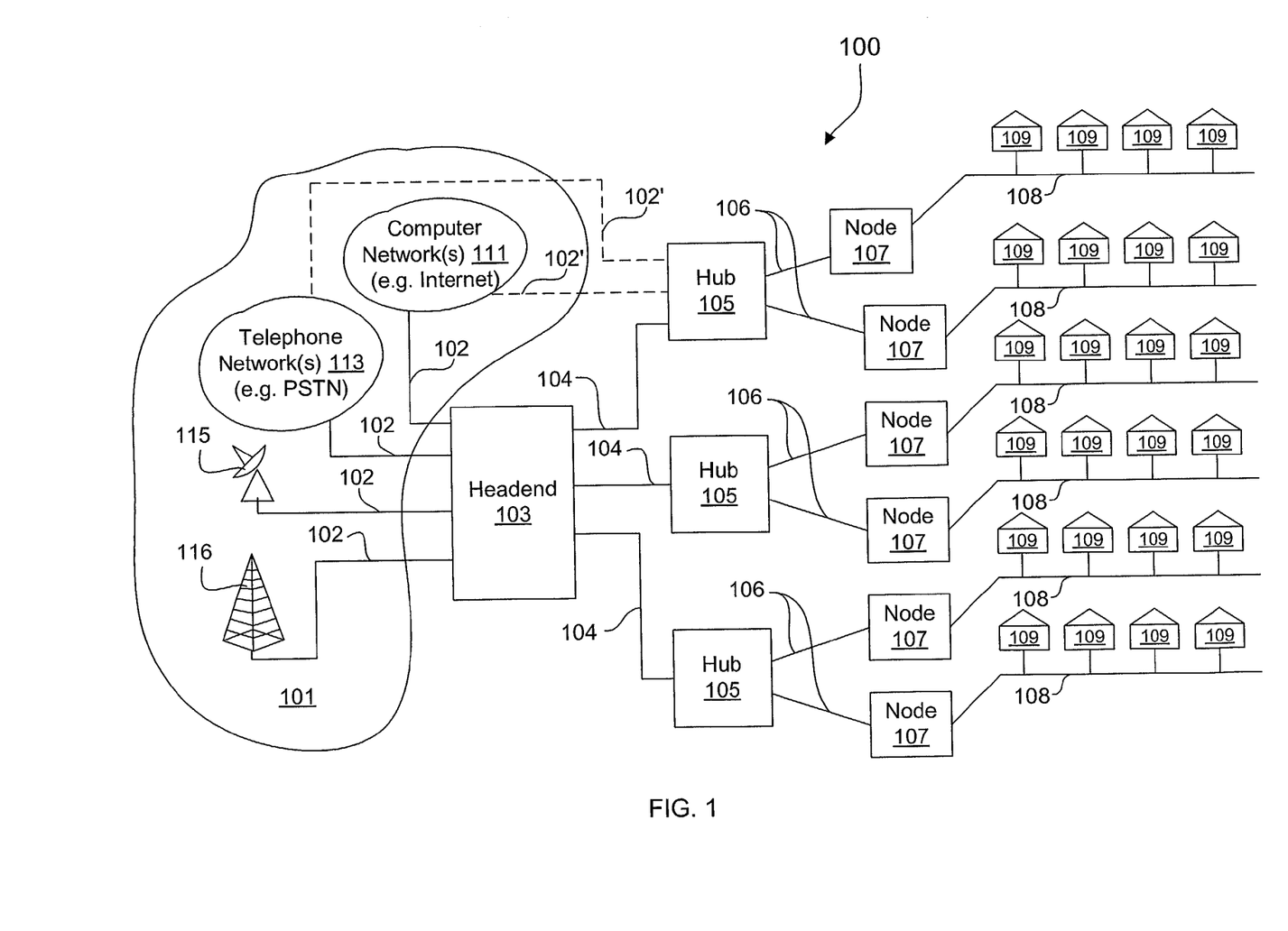
FIG. 1 is a block diagram of a communication network architecture according to an exemplary embodiment of the present invention.

FIG. 1 is a block diagram of an exemplary communication system 100 with an exemplary network architecture. One or more sources 101 are coupled via appropriate communication links 102 to deliver source information to a headend 103, which distributes the source information to one or more distribution hubs 105 via respective communication links 104. Each distribution hub 105 further distributes source information to one or more nodes 107 via communication links 106, where each node 107 in turn distributes the source information to one or more subscriber locations 109 via subscriber links 108. In the embodiment shown, bi-directional communication is supported in which upstream subscriber information from any one or more of the subscriber locations 109 is delivered to the corresponding distribution hub 105 via the corresponding subscriber links 108. Depending upon the nature of the subscriber information and the network architecture, the subscriber information may be delivered to the headend 103, or to an appropriate source 101, by the corresponding distribution hub 105. Again, depending upon the nature of the subscriber information and the network architecture, the subscriber information may be further delivered to an appropriate source 101 by the headend 103.

It is noted that the headend 103, the distribution hubs 105, and the nodes 107, may generically be referred to as points of distribution for source and subscriber information. Each point of distribution supports a successively smaller geographic area. The headend 103, for example, may support a relatively large geographic area, such as an entire metropolitan area or the like, which is further divided into smaller areas, each supported by a distribution hub 105. The areas supported by each distribution hub 105 is further divided into smaller areas, such as neighborhoods within the metropolitan area, each supported by a corresponding node 107.

Many different types of sources 101 are contemplated, such as one or more computer or data networks 111, one or more telephony networks 113, one or more satellite communication systems 115, one or more off-air antenna systems 116 (e.g. microwave tower), etc. The computer networks 111 may include any type of local, wide area or global computer networks, both public and private, such as including the Internet or the like. The telephony networks 113 may include the public switched telephone network (PSTN) or other public or private telephony networks. The satellite communication systems 115 and/or the antenna systems 116 may be employed for reception and delivery of any type of information, such as television broadcast content or the like. The headend 103 may also include video on demand (VOD) equipment (not shown). Depending upon the network architecture, any one or more of the sources 101 may be coupled directly to one or more of the distribution hubs 105, in the alternative, or in addition to being coupled to the headend 103, by communication links 102'. For example, one or more of the computer networks 111 and the telephony networks 113 are shown coupled to a distribution hub 105 in addition or in the alternative. The headend 103 includes appropriate equipment for data transmission, such as, for example, internal servers, firewalls, IP routers, signal combiners, channel re-mappers, etc.

Each of the communication links (102, 102', 104, 106, 108) may be any appropriate media, such as electrical or fiber optic cables or wireless or the like, or any combination of media, such as electrical and optical media and wireless or multiple optical media, etc. For example, in one embodiment, each of the communication links 102 and 102' includes optical media for communicating analog information, such as between the headend 103 and a satellite communication system 115 or an antenna system 116, and/or 1000Base-X Ethernet for communicating digital information between the headend 103 and any computer or telephony network 111, 113. Also, the communication links 106 comprise optical fibers or cables that are distributed between each node 107 and a corresponding distribution hub 105. The network architecture may employ a hybrid fiber coax (HFC) distribution network in which the subscriber links 108 comprises coaxial cables that are distributed from each node 107 to the respective subscriber locations 109. In this configuration, the nodes 107 are optical nodes for conversion between optical and electrical formats. The communication links 104 may also comprise optical links, such as, for example, SONET (Synchronous Optical Network) links or the like. It is understood that any known or future developed media is contemplated for each communication link. In an HFC embodiment, for example, each node 107 receives an optical signal from an upstream point of distribution, converts the optical signal to an electrical signal and distributes the combined electrical signal over a coaxial cable to each of several subscriber locations 109 of a corresponding geographic serving area. Subscriber information is delivered to each node 107 as an electrical signal, which the node 107 converts into an optical signal, and delivers that optical signal upstream to the corresponding distribution hubs 105 via the corresponding communication links 106.

Each subscriber location 109 includes customer premises equipment (CPE) or the like, which further includes a subscriber gateway 203 (FIG. 2) that separates upstream and downstream information, tunes, de-modulates, decodes and selects source information addressed or otherwise intended for the particular subscriber location 109. The gateway 203 may be incorporated within, or otherwise coupled to other subscriber devices, such as set-top boxes, cable modems, etc. The gateway 203 at each subscriber location 109 includes a modulating device or the like that encodes, modulates and up-converts subscriber information into RF signals. The gateway 203 at each of the subscriber locations 109 asserts an upstream RF signal onto the corresponding subscriber link 108, which delivers the signal to a corresponding node 107. A separate channel of the portion of the cable spectrum used for upstream communications may be assigned to each of the subscriber locations 109 to prevent interference with downstream communications. The upstream RF signals are delivered to the node 107, which includes an upstream optical transceiver or the like that converts the subscriber RF signals to an optical signal. For example, laser in the node 107 may be used to convert the return signal to an optical signal and send the optical return signal to an optical receiver at the distribution hub 105 over another fiber optic cable.

Figure 2:
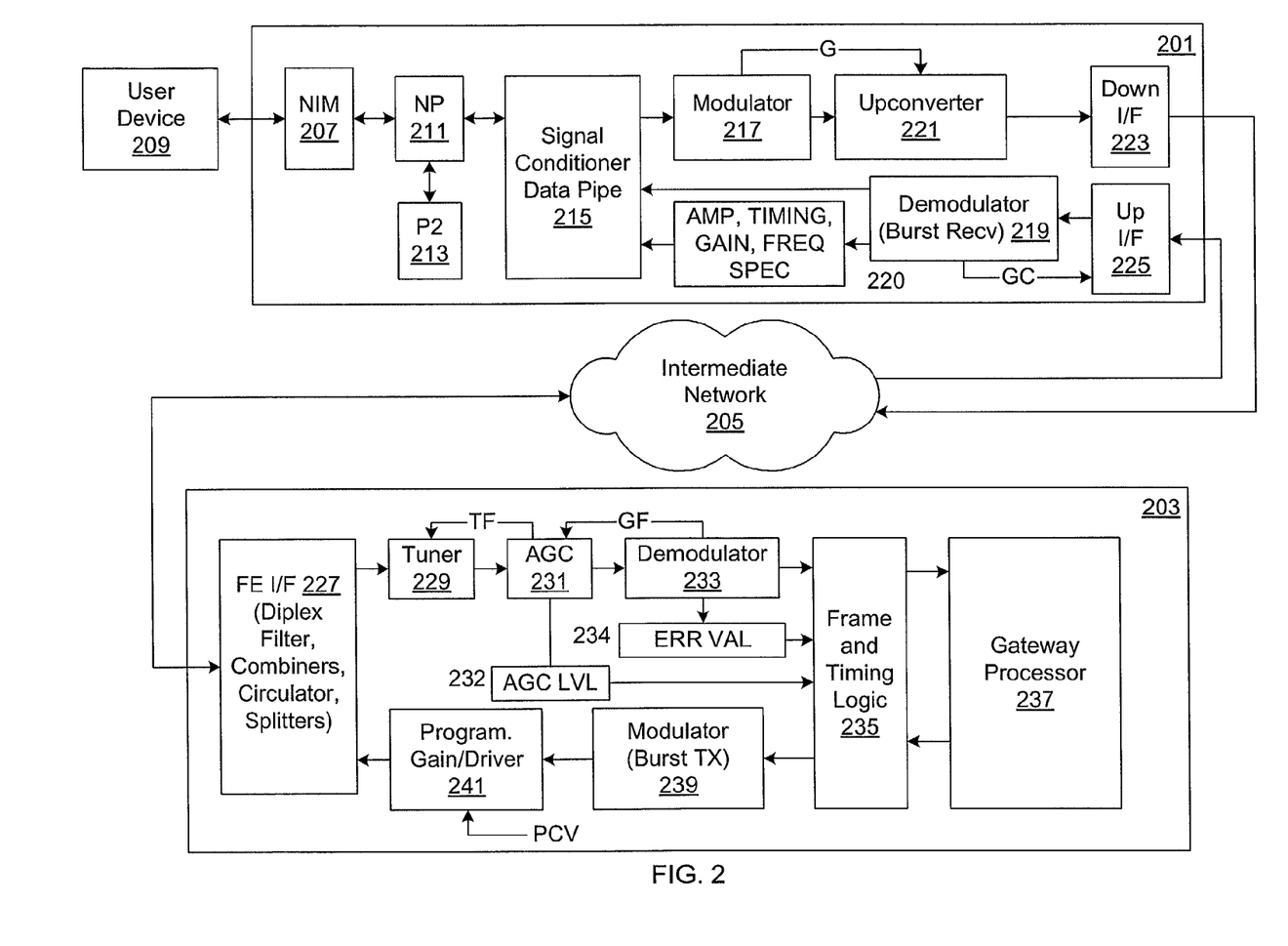
FIG. 2 is a simplified block diagram of a switch router located at an appropriate point of insertion of the communication system of FIG. 1, such as within the headend, and an exemplary gateway located at any selected subscriber location.

The source and subscriber information may include any combination of video, audio or other data signals and the like, which may be in any of many different formats. The source information may originate as fixed- or variable-size frames, packets or cells, such as Internet Protocol (IP) packets, Ethernet frames, Asynchronous Transfer Mode (ATM) cells, etc., as provided to the distribution hubs 105. Any such type of digital information in fixed- or variable-sized frames, packets or cells for both up and downstream data is referred to herein as "packetized" data. The packetized data includes one or more destination addresses or the like indicating any one or more specific subscriber devices at the subscriber locations 109 or other locations in the communication system 100. In exemplary embodiments of the distribution hubs 105, packetized data is converted and delivered to the subscriber locations 109 employing Time Division Multiplexing (TDM) over broadband modulation. Such TDM over broadband modulation enables the delivery of allocated, unshared and deterministic bandwidth to the subscribers in the communication system 100. The gateway 203 at each subscriber location 109 includes the appropriate communication equipment to tune, demodulate and decode the TDM over broadband information to deliver the original content to one or more subscriber devices. Upstream subscriber packetized data is converted to frames or codewords in a similar manner. In the embodiment shown, the upstream data is transmitted in bursts using a Time Division Multiple Access (TDMA) over Frequency Division Multiple Access (FDMA) scheme. Each gateway 203 transmits data and information in one or more assigned timeslots of at least one upstream frequency channel.

It is noted that many different modulating frequencies and techniques are contemplated for both downstream and upstream communications. Modulation techniques may include, for example, Frequency Shift Keying (FSK), Quadrature Phase-Shift Keying (QPSK), as well various types of Quadrature Amplitude Modulation (QAM), such as QAM 16, QAM 64, QAM 256, etc., among other modulation techniques. Also, each frequency or "physical" channel may have any predetermined bandwidth, such as 1 MHz, 3 MHz, 6 MHz, 12 MHz, etc., or slight variations thereof. Each subscriber channel typically includes a separate downstream and upstream channel separated in frequency, where the corresponding downstream and up stream channels may have the same or different frequency band width. Further, the modulation technique employed for each downstream channel may be similar or substantially different than the modulation technique employed for each upstream channel.

In one embodiment, the communication system 100 is an HFC system that supports analog television broadcast transmission in which broadcast television channels are allocated to a particular frequency range of the overall available RF cable television spectrum (54 MHz–550 MHz). The remaining portion of the RF cable television spectrum is utilized to assign data channels including any combination of downstream and upstream channels. For example, some HFC systems implement an extended sub-split frequency plan with a return band, which extends from 5 to 42 MHz, and a forward band, which extends from 54 to 750–860 MHz. It is understood that the particular frequency ranges described herein are exemplary only and that any frequency allocation scheme may be employed depending upon the desired configuration. In one exemplary embodiment, the entire forward band is segmented into 6 MHz channels according to the channelization plan implemented by the particular HFC network operator. For typical HFC plants supporting analog television broadcasts, 80 analog channels are transmitted in the forward band between 54 and 550 MHz. In such HFC networks, satellite signals and local analog stations are mapped to 6 MHz broadcast channels within the forward band at the headend 103. Each 6 MHz forward band channel may contain an analog channel or one or more digital channels that are MPEG encoded. The return band (5–42 MHz) and the remaining forward band spectrum, including frequency ranges 550 to 750–860 MHz, is allocated to subscriber digital channels and/or data transmission for dedicated bandwidth to each subscriber location 109. For example, the frequency range 550 to 860 MHz is allocated for downstream channels and the frequency range 5 to 42 MHz is allocated for upstream channels. The frequency range 42–54 MHz is the location of a diplex filter that separates the downstream communications from the upstream communications. Diplex filters allow for bi-directional communication over the shared HFC fiber and coaxial medium. The basic diplex filter consists of a high pass and a low pass filter in parallel followed by an amplifier that are both driven from the same source.

In alternative embodiments of the communication system 100, such as in an all-digital HFC system, a substantial portion or the entire available spectrum is utilized to assign channels to each of the subscribers. In an all-digital HFC network, for example, there is no channel-on-channel carry requirement of matching analog channel frequency assignments to off-air frequencies (i.e. broadcasting cable channel 2 at 54 MHz over the HFC plant, in accordance with the HRC frequency plan). As a result, the filter frequency settings on the diplex filter may be adjusted upwards in an all-digital network from that of the extended sub-split frequency plan to increase spectrum available for upstream communications. For instance, mid-split and high-split frequency plans, which are suitable for an all-digital network, allocate the 5–86 MHz and 5–186 MHz ranges, respectively, for upstream transmission. Consequently, all-digital networks allow more upstream bandwidth for interactive services, such as data over cable services, packet telephony, video conferencing, interactive gaming, etc. In these all-digital embodiments, the relatively large bandwidth otherwise consumed by television broadcast information is available for channel assignments. This provides a significant advantage since a very "clean" portion of the RF spectrum (e.g., 50–300 MHz) may be employed for data communication. Each user may be allocated a greater amount of bandwidth or a greater number of subscribers may be served by each coaxial cable. A different frequency spectrum split may be utilized to increase upstream bandwidth availability, and to enable a more symmetrical configuration with more equal downstream and upstream bandwidth allotments. Embodiments with a smaller geographical serving area introduce less noise and need less amplification so that each subscriber location 109 receives a cleaner signal, increasing overall reliability and throughput.

FIG. 2 is a simplified block diagram of a switch router 201 located at an appropriate point of insertion of the communication system 100 and an exemplary gateway 203 located at any selected subscriber location 109. The point of insertion may be at any one of the points of distribution, such as the headend 103, any hub 105 or any node 107. The switch router 201 and gateway 203 communicate with each other via an intermediate network 205, which represents any corresponding intermediate network equipment and communication links between the switch router 201 and gateway 203 depending upon the particular point of insertion. For the exemplary communication system 100, the intermediate network 205 at least includes corresponding intermediate communication links 106 and 108, any intermediate network equipment located at the point of insertion and an intermediate node 107. If the point of insertion is the headend 103, then the intermediate network 205 includes an intermediate distribution hub 105 and associated links. It is appreciated, however, that the intermediate network 205 is not limited to the exemplary communication system 100, but instead includes any newly established or pre-existing cable plant incorporating new or legacy cable equipment including cable plants established for cable television (CATV) or any HFC plant.

The intermediate network 205 is often uncharacterized in that certain communication parameters and characteristics may not be known at the time that cable communication equipment is installed. Such parameters and characteristics of the applicable communication frequency ranges may include, for example, frequency spectrum, noise level metrics (such as carrier or signal to noise ratio), power loss metrics, etc. It is also desired to know the available frequency ranges and associated guard bands necessary for an existing cable network. Even if some of these parameters or characteristics have been measured or are otherwise known, they may dynamically change due to weather conditions, subscriber interferences and connections and/or failure of network links or equipment. The switch router 201 and gateway 203 are configured according to embodiments of the present invention to measure these and other parameters of the intermediate network 205, which enables reduced installation time, provides early and real time characterization of any CATV or HFC plant, dynamically establishes the system RF link budget, and reduces the amount of equipment and human errors in the field during installation and over time. The switch router 201 and gateway 203 include a diagnostic system that performs diagnostic procedures during installation and at any time thereafter. As described further below, the diagnostic information may be used to calibrate the communication equipment and to provide additional characterization information useful to cable network operators.

The switch router 201 includes one or more network interface modules (NIMs) 207, each configured to interface and terminate links of a corresponding network communication architecture to establish bi-directional communications with devices compatible with the particular architecture. For example, the NIM 207 may be configured to interface an Ethernet architecture (e.g., 100Base-TX, 1000Base-X, 1000Base-SX, 1000Base-LX, 1000Base-LH, etc.). Each NIM 207 is directly or indirectly linked to any desired combination of local or upstream devices, such as the computer or data networks 111, the telephony networks 113, the satellite communication systems 115, the antenna systems 116, etc., for providing LAN, MAN or WAN connectivity. In the embodiment shown, the NIM 207 enables bi-directional communications between a user device 209, such as a laptop computer or the like, and a network processor (NP) 211. The NP 211 generally performs packet processing, including forwarding, link layer framing and physical layer encoding for bi-directional transmission of packetized information, as well as physical and link layer framing. An exemplary processor is the C-Port C-5 Digital Communications Processor by Motorola, Inc. (Motorola), although other suitable communications processors or processing logic may be used. The NP 211 may include supporting internal or external memory for table-lookups, queued data payload buffer descriptors and data payload buffer storage. Such memory may include any combination of read only memory (ROM) or random access memory (RAM) devices.

The user device 209 incorporates any type of management or control system, such as Command Line Interface (CLI) or any Web-based Management System (WMS), and enables a user or administrator to send commands and gather measured information for purposes of initiating and performing calibration and diagnostics as further described below. In one embodiment, the user device 209 includes an appropriate network interface card (NIC) or the like that is coupled to the NIM 207 using an appropriate network link, such as a CAT 5 cable or the like typically used for Ethernet communications. In this manner, the user device 209 may be connected at any time to conduct a diagnostic procedure, such as during installation of the switch router 201 or any gateway 203. The NP 211 receives a diagnostic command from the user device 209 and initiates a diagnostic and/or calibration procedure, described further below. A separate microcontroller or microprocessor (P2) 213 is provided and coupled to the NP 211 for performing designated functions, including diagnostic data interpretation and/or performing Fast Fourier Transform (FFT) on a selected upstream frequency spectrum in accordance with embodiments of the present invention. An exemplary processor is the MPC860 or MPC860P PowerQUICC processor by Motorola, although other suitable processors or equivalent logic are contemplated. Diagnostic information is used for calibration and is also collected by the NP 211 and forwarded to the user device 209.

The switch router 201 includes a signal conditioner data pipe 215, which provides an interface to enable communication between the NP 211 and a downstream modulator 217 and an upstream demodulator 219. In one embodiment, the signal conditioner data pipe 215 is implemented by a Field Programmable Gate Array (FPGA), although alternative implementations or configurations are contemplated. The signal conditioner data pipe 215 includes an encoder (not shown), which performs continuous-mode randomization, error encoding and interleaving on separate streams of data in the downstream direction. In one embodiment, the modulator 217 performs QAM-256 for data transmission in at least one downstream channel by converting digital data into a corresponding analog signal at an intermediate frequency (IF). The output from the modulator 217 is combined with other downstream signals in the frequency domain by an RF transmitter network (not shown) within an upconverter 221, which, combined with a downstream interface (I/F) 223, provides a single combined, up-converted, amplified, and filtered output via a corresponding transmitter RF link (not shown). Such analog RF processing includes filtering, frequency combining and mixing. The modulator 217 asserts a gain signal G to the upconverter 221 for controlling the power level of the downstream channel. The downstream interface 223 provides a conduit for an RF signal to the gateway 203.

Upstream information from the gateway 203 is received through an upstream interface 225, which comprises an Analog Front End (AFE) or the like that processes analog RF signals. Such processing may include, for example, frequency tuning, filtering, channel splitting and mixing. In one embodiment, the upstream interface 225 tunes to a selected upstream channel, converts a received upstream signal to an IF signal, amplifies (or attenuates) the IF signal according to a gain control (GC) signal from the demodulator 219, and converts the IF signal from analog to digital format. The digital signals are provided to the demodulator 219, which performs automatic gain control (AGC) and generates the corresponding GC signal and which demodulates the digital data according to a selected upstream modulation scheme. In one embodiment, the demodulator 219 comprises one or more burst mode QAM-16 receivers. The demodulated data is provided to the signal conditioner data pipe 215, which performs synchronization functions and conditions the demodulated data for access by the NP 211. In the embodiment shown, the demodulator 219 selectively generates diagnostic information stored in a memory 220. The diagnostic information may include, for example, amplitude, timing (phase), gain and frequency spectrum information on a received upstream test signal. The diagnostic information is provided to the NP 211 via the signal conditioner data pipe 215.

The gateway 203 includes a front end (FE) I/F 227 for interfacing the cable subscriber link 108 of the intermediate network 205 for enabling bi-directional communication with the switch router 201. The FE I/F 227 includes the RF diplex filter, RF spectrum combiners, splitters, etc. A tuner 229 is coupled to the FE I/F 227 and tunes to the selected downstream channel to isolate and convert an RF signal from the switch router 201 in the assigned channel to a corresponding intermediate frequency (IF) analog signal. The downstream signal is provided through an automatic gain control (AGC) circuit 231 to control the gain of the incoming signal to within a target power level. The signal is forwarded to a demodulator 233, which generally performs the demodulation procedure corresponding to the particular modulation scheme employed, such as QAM-256 or the like, and converts the received signal into a demodulated digital signal. A gain feedback (GF) signal is provided from the demodulator 233 to the AGC circuit 231 and a tuner feedback (TF) signal is provided from the AGC circuit 231 to the tuner 229 to generally control amplitude and power level of the received downstream signal. The AGC circuit 231 develops an AGC level (LVL) value stored in a memory 232 that represents a power error or differential between a power level of the received signal and the target power level. The demodulator 233 selectively determines diagnostic information from a downstream test signal, such as amplitude, timing (phase), frequency and power information, and stores the diagnostic information in an appropriate memory 234. The diagnostic information may comprise, for example, an error value (ERR VAL) between a downstream test signal received and a predetermined signal with known characteristics, such as amplitude, frequency and timing parameters.

The demodulated digital signal is then provided to frame and timing logic 235, which detects sync bytes in the data stream and extracts one or more digital codewords within each group of data that corresponds to its assigned transport channels. The frame and timing logic 235 may be implemented using a FPGA or the like. The frame and timing logic 235 includes a decoder (not shown) which performs a de-interleaving decoding processes corresponding to the encoder of the signal conditioner data pipe 215. The frame and timing logic 235 may also perform additional functions to condition the digital data for accessibility by a gateway processor 237. The gateway processor 237 performs appropriate packet functions to re-assemble the original packets transmitted, and forwards the digital packetized information to an appropriate subscriber device, such as an appropriate MAC/PHY device (not shown). An exemplary processor is the MPC8260 by Motorola, although other suitable processors or processing logic is contemplated. The gateway processor 237 also receives the gain and AGC LVL values from the memories 232, 234, either directly or via the demodulator 233 and/or the frame and timing logic 235. The gateway processor 237 interprets the diagnostic information, such as calculating a power loss metric and a noise level metric for the downstream channel. The gateway processor 237 transmits the determined diagnostic information to the switch router 201 in a selected upstream channel. The gateway processor 237 may also initiate transmission of an upstream test signal for upstream calibration in the selected upstream channel, as further described below. In one embodiment, the upstream test signal comprises a tone with predetermined characteristics, such as predetermined frequency, amplitude, and timing information.

Upstream data and information from the gateway processor 237 is provided through the frame and timing logic 235 to a modulator 239. The frame and timing logic 235 includes a buffer (not shown) and performs timing and synchronization functions for upstream transmission. The modulator 239 modulates upstream data according to a selected modulation scheme. In one embodiment, the modulator 239 is a QAM-16 or QPSK burst transmitter, which converts digital information into burst RF signal energy for transmission via the intermediate network 205 via a selected upstream channel. The upstream information may also be designated to one or more time slots of the selected upstream channel. In one embodiment, the modulator 239 generates a test tone as the upstream test signal provided to the switch router 201 for upstream calibration, where the test tone has predetermined characteristics. The test tone may correspond, for example, to a selected constellation point of the QAM-16 constellation. Any selected constellation point may be employed, although a constellation point having maximum scale (e.g., maximum amplitude and phase) provides maximal diagnostic information.

The RF upstream signal is asserted on the intermediate network 205 via the FE I/F 227 and a programmable gain and driver block 241. The power level of the transmitted upstream signal is controlled by a power control value (PCV) provided from the modulator 239 or another control device, such as the gateway processor 237. In one embodiment, the programmable gain and driver block 241 does not perform AGC functions, but instead amplifies or attenuates by a static amount determined by the PCV. The PCV is programmed through using a lookup table, software, programmable registers, or the like. In one embodiment, an upstream power loss metric is determined by the switch router 201 based on the upstream test signal from the gateway 203, and the switch router 201 transmits power control information back to the gateway 203 for purposes of programming the PCV for upstream power calibration.

Figure 3:
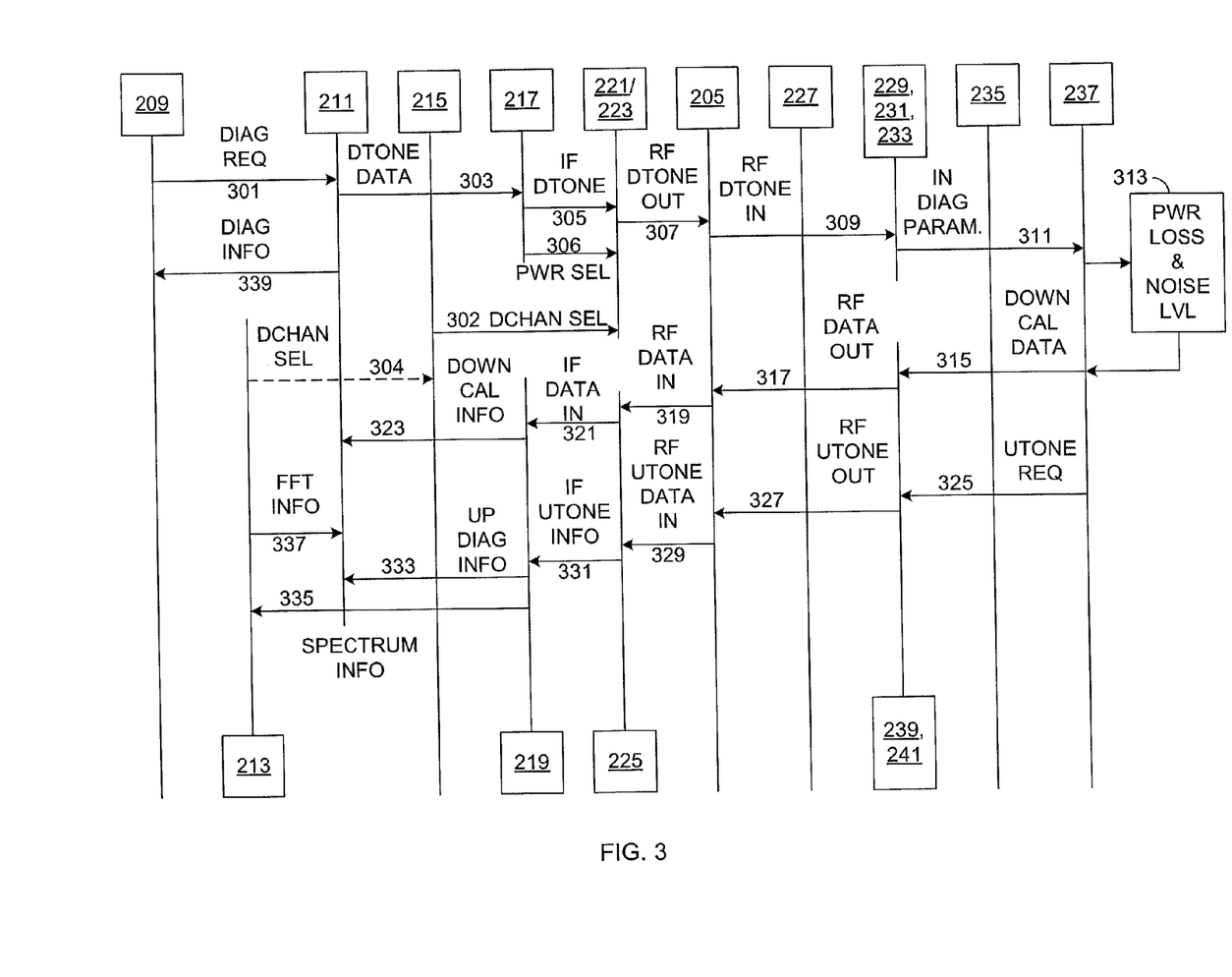
FIG. 3 is a signal flow diagram illustrating a diagnostic and calibration procedure according to an embodiment of the present invention.

FIG. 3 is a signal flow diagram illustrating a diagnostic and calibration procedure according to an embodiment of the present invention. Blocks are included to represent designated components of the switch router 201, the intermediate network 205 and the gateway 203. Vertical lines connecting components and horizontal signal lines represent processing or signal flow by the indicated component. It is assumed that a few preliminary communication particulars are determined prior to conducting the diagnostic procedure. Such communication particulars include selected downstream and upstream channels and/or time slots and corresponding timing parameters that are established to provide at least rudimentary communication between the switch router 201 and the gateway 203. The NP 211 is configured for network diagnostic mode in any one of several ways. In the embodiment shown, the user device 209 is connected to a port interfaced via the NIM 207 of the switch router 201 for sending commands and receiving data and information.

To initiate diagnostics in the embodiment shown, the user device 209 submits a diagnostic request 301 to the NP 211. The NP 211 determines at least one downstream tone (DTONE) to be transmitted to the gateway 203 and sends corresponding DTONE data 303 to the modulator 217 via the signal conditioner data pipe 215. In one embodiment, the modulator 217 is a QAM-256 modulator and the selected tone corresponds to at least one constellation point of a QAM-256 constellation. The selected constellation point has predetermined frequency, amplitude and timing (phase) characteristics. Any tone is suitable, although a tone with maximum scale (e.g., maximum amplitude and phase displacement) is preferable to provide more accurate diagnostic measurement. The gateway 203 is pre-configured for diagnostics and is programmed with knowledge of the selected tone and its associated characteristics. The modulator 217 generates the selected tone and provides an intermediate frequency (IF) DTONE 305 to the upconverter 221. The upconverter 221 is shown in combination with the downstream I/F 223, which asserts a corresponding RF DTONE 307 onto the intermediate network 205 using a selected downstream channel. The particular downstream channel is selected by the signal conditioner data pipe 215 as shown at 302 (DCHAN SEL), which may optionally be selected by the processor 213 as shown by dashed line 304. For example, the signal conditioner data pipe 215 and/or the processor 213 asserts a value indicative of the center frequency of the selected channel. The modulator 217 also controls the level of power of the downstream signal as indicated a PWR SEL 306. The power select 306 may be controlled, for example, using the gain signal G provided by the modulator 217 to the upconverter 221. It is noted, however, that the signal conditioner data pipe 215, the NP 211 and/or the processor 213 may ultimately control the selected power level. In any event, the power level of the downstream test signal is predetermined and known or otherwise programmed within the gateway 203.

The tuner 229 is programmed to the selected downstream channel and/or corresponding center frequency thereof and thus receives the transmitted tone as an input RF DTONE 309 via the FE I/F 227. The tuner 229 provides the IF channel signal to the AGC 231, which adjusts the AGC level (LVL) value in the memory 232 according to a predetermined or programmed target value. The gain adjusted input signal is provided to the demodulator 233. During normal operation, the demodulator 233 determines amplitude and timing or phase information of the input signal and identifies the closest constellation point, which can then be converted to corresponding digital data. For purposes of diagnostics, however, the data being received is the predetermined downstream tone DTONE having known characteristics, such as the selected QAM-256 constellation point. hi this manner, the demodulator 233 generates an error value or error vector that represents the difference between the received tone and the intended or transmitted tone. The error value (ERR VAL) is stored in the memory 234. The AGC LVL 232 and the ERR VAL 234 are forwarded to the gateway processor 237 via the data pipe 235 as input diagnostic parameters 311. The gateway processor 237 receives and converts the input diagnostic parameters 311 to power loss and noise level (PWR LOSS & NOISE LVL) information 313. Since the target power level of the AGC 231 is known, the AGC LVL 232 is used to determine the actual power level of the received signal. The actual power level is compared with the predetermined power level of the downstream test signal asserted by the switch router 201 to determine the power loss metric. The gateway processor 237 uses the ERR VAL 234 to calculate a noise metric, such as a signal to noise ratio (SNR) or a carrier to noise ratio (CNR) as known to those skilled in the art.

The power loss and noise level information 313 is forwarded by the gateway processor 237 as downstream calibration data 315 to the modulator 239 via the data pipe 235. The modulator 239 asserts corresponding RF data output 317 to the intermediate network 205 via the FE I/F 227 on a selected upstream channel. It is noted that the selected upstream channel may not yet be tested, such as during an installation diagnostic test. In one embodiment, the modulator 239 and the demodulator 219 are configured to operate using a different and more robust modulation scheme, such as QPSK or the like. QPSK, for example, may not provide the desired level of data throughput as achieved by QAM-16, but is less susceptible to noise and sufficient for purposes of transmitting diagnostic information to the switch router 201. The upstream I/F 225 receives corresponding RF data input 319 from the selected upstream channel and asserts corresponding IF data input 321 to the demodulator 219. The demodulator 219 retrieves and forwards the downstream diagnostic information 323 to the NP 211 via the signal conditioner and data pipe 215. The downstream diagnostic information 323 is forwarded by the NP 211 as part of diagnostic information 339 forwarded to the user device 209.

The downstream power loss metric is used for downstream power calibration, such as by controlling the gain signal G from the modulator 217 to the upconverter 221 for the particular downstream channel. For example, the power of the transmitted RF signal may be amplified or attenuated to more closely correspond with the target power level of the AGC 231 within predetermined thresholds. The power loss metric may also be used for cable network diagnostics and troubleshooting. For example, after multiple gateways are installed on multiple subscriber links 108 through multiple nodes 107 and or hubs 105 and corresponding links 106, the diagnostic procedure may be repeated for each installed gateway to possibly isolate and identify particular network equipment that is malfunctioning. The downstream noise level metric is used to determined whether the selected downstream modulation scheme, such as QAM-256, is realizable for the particular intermediate network 205. For example, it may be desired to achieve a predetermined threshold SNR before completing installation and attempting normal operation. If the requisite noise level metric is not achieved, then the intermediate network 205 may be repaired or upgraded, or at least the operator of the associated cable network is informed that the requisite communication characteristics have not been met. It is noted that the downstream diagnostic procedure is operational even if the noise level on the downstream channel is sufficiently high to prevent QAM-256 communication. If the signal is not received or if a received signal indicates a substantial noise level, which information is reflected in the downstream calibration data 315.

In the same or different transmission, the gateway processor 237 submits an upstream tone (UTONE) request 325 to the modulator 239. The modulator 239 generates and asserts a corresponding RF UTONE signal 327 onto the intermediate network 205 via the programmable gain driver 241 and the FE I/F 227 in the selected upstream channel. The UTONE is predetermined and has known characteristics in a similar manner as the DTONE, such as having known amplitude, frequency and timing information. In one embodiment, the UTONE corresponds to a selected constellation point of a QAM-16 constellation. A corresponding RF UTONE input 329 is received by the upstream I/F 225, which asserts a corresponding intermediate frequency UTONE signal 331 to the demodulator 219. The demodulator 219 receives the UTONE signal 331 and determines upstream diagnostic information 333, including, for example, amplitude, timing, frequency and gain information. The demodulator 219 performs AGC in a similar manner as the demodulator 233 to derive gain information. The received signal is compared to the predetermined known signal for generating an error value or vector, such as comparison of amplitude and phase of the received signal tone compared to the amplitude and phase of the predetermined QAM-16 constellation point. The upstream diagnostic information 333 is stored in the memory 220 and forwarded to the NP 211 via the signal conditioner and data pipe 215.

The demodulator 219 also forwards frequency spectrum information 335 to the NP 211, which may include spectrum information of the selected upstream channel or the entire upstream bandwidth, such as within the applicable frequency range of 0–42 MHz for an extended sub-split frequency plan. The NP 211 forwards the spectrum information 335 to the processor 213, which performs an FFT analysis (frequency conversion) on the spectrum information 335 to generate FFT information 337. The FFT information 337 includes important frequency spectrum information that defines upstream frequency characteristics of the intermediate network 205. The FFT information 337 is provided to the NP 211. The NP 211 thus receives the downstream and upstream diagnostic information 323 and 333 and the FFT information 337, which are collectively provided to the user device 209 as the diagnostic information 339.

The NP 211 and/or the processor 213 may be programmed to analyze the upstream diagnostic information 333. The error value from the demodulator 219 is used to determine an upstream noise level metric associated with the selected upstream channel, such as SNR or CNR in a similar manner as described above for the downstream noise level metric. The upstream noise level metric is used, for example, to determined whether the selected upstream modulation scheme, such as QAM-256, is realizable over the particular intermediate network 205. In a similar manner as described above for the downstream, it may be desired to achieve a predetermined threshold SNR for the upstream channel before completing installation and attempting normal operation. If the requisite noise level metric is not achieved, then the intermediate network 205 may be repaired or upgraded, or at least the operator of the associated cable network is informed that the requisite communication characteristics have not been met.

Gain information from the demodulator 219 is used to derive the power level of the received signal (e.g. RF UTONE input 329), which is then compared to the predetermined power level of the transmitted signal (e.g., RF UTONE signal 327) to derive an upstream power loss metric. The upstream power loss metric is used for power calibration of the upstream channel between the modulator 239 and the demodulator 219. The switch router 201 determines, for example, the correct level of the PCV, which establishes the gain of upstream transmitted signals. The switch router 201 sends a downstream communication to the gateway processor 237, which programs the PCV accordingly. Upstream communication is then established near the desired power level, so that the demodulator 219 need only provide minor AGC adjustments over time. The upstream power loss metric may also be employed for cable network diagnostics and troubleshooting in a similar manner as described above for the downstream power loss metric.

The FFT information 337 generated by the processor 213 provides a more comprehensive and real-time frequency analysis of the upstream channel and/or entire upstream bandwidth. In respective embodiments, the demodulator 219 is programmed to digitize the selected upstream channel or the entire upstream spectrum. The spectrum information is converted to the FFT frequency information by the processor 213, which information may be used to identify any trouble areas, such as noise spikes and/or radiation spurs in the applicable frequency spectrum. Although the FFT information 337 is not directly used for purposes of calibration, such information may be used to identify any upstream trouble spots that may be avoided or otherwise corrected. The information may be provided to the operator of the intermediate cable network for troubleshooting or upgrading the network. The diagnostic process can be performed anytime to provide real-time frequency information.

It is now appreciated that RF characterization of a cable plant and corresponding calibration of communication equipment according to embodiments of the present invention provides several benefits and advantages. In summary, predetermined downstream and upstream test signals are transmitted between a first transceiver located at a point of insertion and a second transceiver located downstream, such as at a potential subscriber location. Noise level metrics are measured to identify potential communication problems with selected modulation schemes. Power loss metrics are measured and used for power calibration of respective transmitters. Real-time frequency spectrum information is measured to identify communication problems and to facilitate troubleshooting or upgrading of network equipment. The diagnostic information is used to calibrate equipment during installation and periodically during normal operation or in the event of malfunction or failure. The diagnostic procedure provides early and real-time characterization of the underlying cable network. The diagnostic procedure also dynamically establishes a system RF link budget. The diagnostic procedure reduces installation time and the amount of equipment and human errors in the field.

A particularly significant benefit is that the diagnostic capability is built into the same equipment installed to conduct normal communications, so that the need for specialized test equipment is significantly reduced. The diagnostic system provides invaluable network characterization information and facilitates the installation process. The diagnostic system further may be used at any time during normal operation or in the event of network problems. The installation process for each gateway is streamlined and simplified and the existence of multiple gateways distributed on multiple subscriber links establishes a powerful diagnostic tool to isolate and locate network problems. In this manner, the diagnostic system is able to characterize multiple downstream channels since each gateway occupies a different channel.

Although various embodiments of the present invention have been described in detail, it should be understood that various changes, substitutions and alterations can be made hereto without departing from the spirit and scope of the invention as described by the appended claims. For example, functionality provided by specific components, such as processors or the like, may be implemented using any suitable alternative means, such as logic circuitry or software.

The invention claimed is:

1. A bi-directional cable communication system configured to communicate information via a cable network, the cable communication system incorporating diagnostic and calibration logic, the cable communication system comprising:

a first transceiver, coupled at a selected point of distribution of the cable network, that transmits a downstream test signal having predetermined characteristics on the cable network in a selected downstream channel at a predetermined power level, that receives corresponding downstream diagnostic information in a selected upstream channel, the downstream diagnostic information including a downstream power loss metric, and that calibrates downstream transmission power based on the downstream power loss metric;

a second transceiver, coupled to the cable network at a selected downstream location, that receives the downstream test signal in the selected downstream channel, that compares the received downstream test signal with the predetermined characteristics and power level to determine the downstream diagnostic information including a downstream power loss metric and a downstream noise level metric for the selected downstream channel, and that transmits the downstream diagnostic information in the selected upstream channel;

the second transceiver transmitting an upstream test signal with predetermined characteristics on the cable network in the selected upstream channel at a predetermined power level, that receives corresponding upstream power information in the selected downstream channel, and that calibrates upstream transmission power based on the upstream power information; and the first transceiver receiving the upstream test signal, comparing the received upstream test signal with the predetermined characteristics and power level to determine corresponding upstream diagnostic information including an upstream power loss metric and an upstream noise level metric in the selected upstream channel, determining the upstream power information based on the upstream power loss metric, and transmitting the upstream power information in the selected downstream channel.

2. The cable communication system of claim 1, wherein the first transceiver further comprises diagnostic logic that determines if downstream communication using a selected downstream modulation scheme is realizable based on the downstream noise level metric and that determines if upstream communication using a selected upstream modulation scheme is realizable based on the upstream noise level metric.

3. The cable communication system of claim 2, wherein the downstream and upstream noise level metrics each comprise a signal to noise ratio.

4. The cable communication system of claim 2, wherein the upstream and downstream modulation schemes are based on quadrature-amplitude modulation (QAM).

5. The cable communication system of claim 4, wherein the selected downstream modulation scheme is QAM-256 and wherein the selected upstream modulation scheme is QAM-16.

6. The cable communication system of claim 1, wherein the first transceiver calibrates an attenuation factor for the selected upstream channel.

7. The cable communication system of claim 1, wherein the predetermined characteristics for both the downstream and upstream test signals include frequency, timing and amplitude information.

8. The cable communication system of claim 1, wherein the downstream test signal is a tone based on a selected constellation point of a QAM-256 constellation and wherein the upstream test signal is a tone based on a selected constellation point of a QAM-16 constellation.

9. The cable communication system of claim 1, wherein the first transceiver determines upstream spectrum information from the upstream test signal, and includes diagnostic logic that performs a frequency transform of the upstream spectrum information to determine upstream frequency characteristics.

10. The cable communication system of claim 9, wherein the diagnostic logic performs a Fast-Fourier Transform (FFT) of the upstream spectrum information to determine the frequency characteristics of the upstream communication bandwidth.

11. A communication system configured to communicate across a cable system having a point of distribution and at least one downstream subscriber cable link, the communication system configured to operate in a diagnostic and calibration mode, the communication system comprising:

a switch router, coupled to the cable system at the point of distribution, that transmits a predetermined downstream test signal at a predetermined power level using a selected downstream channel, that receives corresponding downstream channel diagnostic information including downstream channel power loss, that calibrates transmission power for the downstream channel based on the downstream channel power loss, that receives an upstream test signal and determines corresponding upstream channel power loss and noise level, and that transmits corresponding upstream channel power information on the selected downstream channel; and at least one gateway, each gateway coupled to a corresponding downstream subscriber cable link, each gateway transmitting a predetermined upstream test signal at a predetermined power level in a selected upstream channel, that receives the corresponding upstream channel power information, that calibrates transmission power of the selected upstream channel based on the upstream channel power information, that receives the predetermined downstream test signal and determines downstream channel diagnostic information including downstream channel power loss and noise level, and that transmits the downstream channel diagnostic information in the selected upstream channel.

12. The communication system of claim 11, wherein the at least one gateway comprises a plurality of gateways, each gateway coupled to corresponding downstream subscriber cable links, and wherein the switch router and the plurality of gateways collectively operate in the diagnostic and calibration mode to calibrate a corresponding pair of downstream and upstream channels for each gateway.

13. The communication system of claim 11, wherein the switch router determines if downstream communication is realizable using the selected downstream modulation scheme for the selected downstream channel and wherein the switch router determines if upstream communication is realizable using the selected upstream modulation scheme for the selected upstream channel.

14. The communication system of claim 11, wherein the switch router comprises:

a switch router controller that operates the switch router in diagnostic mode;

a downstream modulator, coupled to the switch router controller, that operates according to a selected downstream modulation scheme for providing IF modulation information, and that generates the predetermined downstream test signal as a tone based on a predetermined constellation point;

a radio frequency (RF) downstream transmitter, coupled to the downstream modulator and the switch router controller, that converts the IF modulation information into a corresponding RF signal and that transmits the RF signal in a downstream channel and at a power level selected by the switch router controller;

an RF upstream receiver, coupled to the switch router controller, that tunes to a selected upstream channel to convert received upstream RF signals into an IF signals; and an upstream demodulator, coupled to the RF upstream receiver and the switch router controller, that operates according to a selected upstream modulation scheme, that controls receiver gain and provides a gain level indicative thereof, and that determines the upstream channel power loss and noise level based on the received upstream test signal;

wherein the switch router controller determines upstream power information and transmits via the downstream modulator the upstream power information in the selected downstream channel.

15. The communication system of claim 14, wherein the selected downstream modulation scheme is QAM-256 and wherein the selected upstream modulation scheme is QAM-16.

16. The communication system of claim 14, wherein the switch router further comprises:
the upstream demodulator further determining upstream spectrum information using the received upstream test signal; and
the switch router controller including a processor that performs a frequency transform on the upstream spectrum information.

17. The communication system of claim 11, wherein each gateway comprises: a tuner that tunes to a selected downstream channel to receive and convert RF signals into a corresponding IF signals;
a receiver gain control circuit, coupled to the tuner, that controls gain of received IF signals and that generates a gain level value indicative thereof;
a downstream demodulator, coupled to the receiver gain control circuit, that operates according to the selected downstream modulation scheme to demodulate IF signals, the downstream demodulator comparing a downstream test signal with a predetermined downstream modulation constellation point to determine an error value;
a gateway controller, coupled to the downstream demodulator, that determines downstream channel diagnostic information including downstream power loss and noise level of a selected downstream channel based on the gain level value and the error value, that forwards the downstream channel diagnostic information for upstream transmission, and that programs a gain control value to calibrate upstream power level based on received upstream power information;
an upstream modulator, coupled to the gateway controller, that operates according to the selected upstream modulation scheme and that generates an RF upstream test signal based on a predetermined upstream modulation constellation point, that converts the downstream channel diagnostic information into an RF diagnostic signal and that transmits the RF diagnostic signal in the selected upstream channel; and
a programmable gain device, coupled to the upstream modulator and the controller, that amplifies signals transmitted by the upstream modulator according to the programmed gain control value.

18. The communication system of claim 17, wherein the selected downstream modulation scheme is QAM-256 and wherein the selected upstream modulation scheme is QAM-16.

19. A method of characterizing a cable network and calibrating a bi-directional cable communication system, comprising:
transmitting a downstream test signal from a point of distribution on the cable network in a selected downstream channel at a predetermined downstream power level, the downstream test signal having predetermined characteristics;
receiving the downstream test signal in the selected downstream channel at a downstream location;
determining a downstream power loss metric of the selected downstream channel by comparing a power level of the received downstream test signal with the predetermined downstream power level;
transmitting downstream diagnostic information including the downstream power loss and downstream noise level metrics in a selected upstream channel;
calibrating downstream transmit power at the point of distribution based on the downstream power loss metric;
transmitting an upstream test signal from the downstream location on the cable network in a selected upstream channel at a predetermined upstream power level, the upstream test signal having second predetermined characteristics;
receiving the upstream test signal in the selected upstream channel at the point of distribution;
determining an upstream power loss metric of the selected upstream channel by comparing a power level of the received upstream test signal with a predetermined upstream power level;
transmitting upstream power information in the selected downstream channel based on the upstream loss power metric; and calibrating upstream transmit power at the downstream location based on the upstream power information.

20. The method of claim 19, further comprising:
determining a downstream noise level metric of the downstream channel by comparing the predetermined characteristics of the downstream test signal with corresponding characteristics of the received downstream test signal;
determining, based on the downstream noise level metric, if downstream communication is realizable using a selected downstream modulation scheme on the selected downstream channel;
determining an upstream noise level metric of the upstream channel by comparing the second predetermined characteristics with corresponding characteristics of the received upstream test signal; and
determining, based on the upstream noise level metric, if upstream communication is realizable using a selected upstream modulation scheme on the selected upstream channel.

21. The method of claim 19, further comprising:
generating a test tone based on the selected downstream modulation scheme to develop the downstream test signal; and
generating a test tone based on the selected upstream modulation scheme to develop the upstream test signal.

22. The method of claim 21, wherein said generating a test tone comprises selecting a constellation point of a selected modulation scheme, the selected constellation point having known amplitude, frequency and timing information.

23. The method of claim 19, wherein said determining downstream and upstream power loss metrics each comprise:
performing gain control relative to a target power level and generating a gain error level; and
comparing the generated gain error level with a corresponding predetermined power level.

24. The method of claim 19, wherein said determining downstream and upstream noise level metrics each comprise:
comparing frequency, timing and amplitude information between a received test signal and predetermined frequency, timing and amplitude information and generating an error value.

25. The method of claim 19, wherein said determining if downstream or upstream communication is realizable each comprises:
 comparing a determined noise level metric with a predetermined threshold signal to noise ratio.

26. The method of claim 19, wherein said calibrating upstream transmit power at the downstream location comprises programming a gain level value that controls a programmable gain amplifier.

27. The method of claim 19, further comprising: determining an upstream spectrum using the received upstream test signal; and performing a frequency transform function on the upstream spectrum.

28. The method of claim 27, wherein the frequency transform function provides frequency spectrum information for the upstream frequency bandwidth.

* * * * *